United States Patent [19]

Beranger et al.

[11] Patent Number: 4,682,050
[45] Date of Patent: Jul. 21, 1987

[54] SMALL SIGNAL SWING DRIVER CIRCUIT

[75] Inventors: Herve L. Beranger, Fontainebleau, France; Gene J. Gaudenzi, Purdys; Dennis C. Reedy, Stormville, both of N.Y.; Helmut Schettler, Dettenhausen, Fed. Rep. of Germany

[73] Assignee: International Business Machines Corporation, Armonk, N.Y.

[21] Appl. No.: 817,143

[22] Filed: Jan. 8, 1986

[51] Int. Cl.[4] .................... H03K 3/01; H03K 19/088; H01L 9/02; H03B 1/04
[52] U.S. Cl. .................................. 307/270; 307/456; 307/200 A; 307/542; 307/547; 307/562
[58] Field of Search .......... 307/443, 454, 456, 200 A, 307/540, 542, 546-547, 562, 270

[56] References Cited

U.S. PATENT DOCUMENTS 3,192,399  6/1965  Ih ......................................... 307/540
3,867,649  2/1975  Cochran ............................. 307/270
4,471,237  9/1984  Kaplan ............................... 307/454

Primary Examiner—Stanley D. Miller
Assistant Examiner—M. R. Wambach
Attorney, Agent, or Firm—Stanger, Michaelson and Einschlag

[57] ABSTRACT

A small signal swing line driver, that generates a reduced amount of switching noise and also suppresses transients appearing on the line, is described. Specifically, the driver includes a clamp connected to the driver output to limit the maximum DC driver output level and to suppress voltage transients, e.g. reflections, spikes or the like, appearing on the driven line and caused by conditions external to the driver. The driver also contains circuitry to limit the transition times of the rising and falling edges of the driver output signal in order to reduce the amount of switching noise which is generated by the driver and thereafter coupled onto quiet lines.

10 Claims, 3 Drawing Figures

SMALL SIGNAL SWING DRIVER CIRCUIT

BACKGROUND OF THE INVENTION

1. Field of the Invention

The present invention relates to a driver circuit, specifically a small signal swing driver, which generates a reduced amount of switching noise and suppresses voltage transients on the line, such as reflections, appearing at the output of the driver.

2. Description of the Prior Art

Although integrated circuits themselves along with their interconnect topology have become increasingly dense, the need nonetheless exists to route certain digital signals, via interconnect lines, between circuitry located on an integrated circuit chip and off chip circuitry.

In these instances, a digital signal is first applied to a line driver which, in response thereto, applies electrical current to an interconnect line in order to rapidly charge up the line capacitance and thereby cause the digital signal to propagate down the line. Each interconnect line possesses a certain characteristic impedance and hence behaves as a transmission line. Consequently, if the output impedance of the driver located at the near end of the line and a load located at the far end of the line are not equal to the characteristic impedance of the line, reflections result.

In particular, whenever the output of the driver changes state from a logical zero (often a DC potential near ground) to a logical one (often a higher DC voltage), a rising output voltage transition propagates, through the line, from the driver to the far end of the line. If an impedance mis-match exists at the far end resulting from, for example, an open (unterminated) circuit, then, a portion of this transition reflects off the mis-match and propagates back to the near end of the line, i.e. toward the output of the driver. After a time interval—governed by the length of the line and usually on the order of a few nano-seconds for a short line (10 centimeters or less)—has elapsed, the reflection appears at the driver output and combines with the driver output voltage. Similarly, reflections can also be generated by impedance mis-matches occurring at the near end of the line. Near end reflections propagate down the line and cause further reflections at the far end. In any event, depending upon the amplitude of the driver output voltage, the combination of a non-zero driver output voltage and the reflected voltage appearing at the near end of the line may produce a voltage transient which, at the output of the driver, exceeds the voltage produced by the driver itself. The resulting combined voltage appears across the driver output transistors. As a result, this voltage, if it possesses a sufficiently large transient peak amplitude, may destroy these transistors.

Owing to impedance mismatches occurring at both ends of the line, reflections will continue propagating between both ends of the line until the reflected energy has been sufficiently absorbed by resistive loss occurring in both the line and the driver. Hence, the voltage transient will appear as an exponential decaying damped sinusoid.

Further problems arise since inputs to other gates are connected to the interconnect line. Specifically, these gates might sense an undesired high level input signal whenever a transient resulting from a reflection occurs. As a result, these gates might generate erroneous output values which, in turn, might cause improper system operation.

Thus, it is imperative to eliminate reflections whenever possible in the design of digital systems. Although the solution—match all driver output and load impedances to the line—is simple in theory, in practice the complexity of interconnect wiring and/or the diversity of the circuitry connected thereto renders this solution extremely difficult to achieve.

These problems worsen whenever small input swing logic, which provides shortened transition times, decreased switching noise and increased switching speed, is employed. With this logic, the voltage difference between the different logic levels is on the order of one volt or less with the logic levels swinging from, for example, +0.5 volts for a logical zero to +1.5 volts for a logical one. Since the noise margin for such logic is far less than that existing in many other types of digital logic, a small amount of noise, e.g. a voltage transient, on the line, resulting from, for example, reflections, can readily produce a false input condition for a gate connected to that line.

In addition, noise can be coupled into a quiet interconnect line from gates or other lines situated close by but not connected to the quiet line. In this situation, very large and narrow current spikes are often generated by high switching rates (dv/dt on the order of several volts per nano-second) present in nearby gates and/or lines. These spikes, in turn, generate magnetic fields that induce transient voltage spikes, here switching noise, into the quiet interconnect line. These spikes, if sufficiently large, can also cause a false input condition to occur at the input to a small signal swing gate connected to the quiet line.

Furthermore, switching noise can also be coupled through ground paths to all gates situated in a particular circuit or system. Consequently, this noise will appear not only on those gates being switched but also on those that are not. Unfortunately, as switching speeds increase, so does the amount and intensity of switching noise.

Various solutions exist in the art for preventing transients from affecting the output stage of a driver. For example, one solution is described in U.S. Pat. No. 3,979,607 (issued to H. R. Beelitz et al on Sept. 1, 1976—the '607 patent). Here, a driver incorporates a push-pull output stage and a shunting transistor. The base and emitter of the shunting transistor are connected in parallel with the base and emitter, respectively, of the driver pull-down output transistor. In addition, the collector of the shunting transistor is coupled to the base of the driver pull-up output transistor. Whenever the shunting transistor conducts, it limits the amount of base drive available to the pull-down transistor, thereby limiting its collector current. Unfortunately, this arrangement is only useful to suppresses current transients that occur within the driver itself, i.e. excessive currents commonly known as "spike through" currents, that flow between the pull-up and pull-down output transistors whenever both transistors simultaneously conduct. This driver does not have the capability to suppress transients appearing on the line due to conditions, e.g. reflections, that are external to the driver. U.S. Pat. No. 4,031,414 (issued to T. C. Giles on June 21, 1977) shows an arrangement for a rapid rise, short-duration current pulse generator. This arrangement includes a voltage limiting circuit which prevents excessive voltage levels from being applied to an internal current source during the time interval occurring between successive output current pulses. This arrangement, like that shown in U.S. Pat. No. 3,979,607, only prevents transients from occurring within the driver itself and does not suppress externally induced transients which appear on the line.

Therefore, a need exists in the art for a small signal swing logic line driver that generates a reduced amount of switching noise and also suppresses voltage transients that occur on the line which result from conditions external to the driver.

SUMMARY OF THE INVENTION

Accordingly, an object of the present invention is to provide a small signal swing digital line driver that reduces switching noise and voltage transients appearing on an interconnect line.

A specific object is to provide such a driver which not only suppresses transients appearing on the line but also generates a reduced amount of switching noise.

A more specific object is to provide such a driver which suppresses voltage transients on the line that result from reflections and/or other transient conditions external to the driver.

Another more specific object is to provide such a driver that reduces the amount of self-generated switching noise by controlling the switching rate (dv/dt) between logic states and thereby reduces the amount of noise current coupled onto quiet lines.

These and other objects are accomplished in accordance with the teachings of the present invention by a driver having a voltage clamp and output transition control circuit, connected between the output of the driver and an input of an intermediate circuit contained within the driver, for suppressing voltage transients appearing on the line and at the output of the driver and for controlling the transition time in the output signal produced by said driver.

The voltage clamp absorbs energy from the line whenever the line voltage at the output of the driver exceeds a pre-determined threshold value. In this manner, whenever a series of transient peaks, resulting from, for example, reflections, impinges upon the driver output, the clamp will absorb some of the energy contained in each peak and thereby increase the damping imparted to the transient. In this manner, the clamp will appreciably shorten the settling time of the transient and suppress its amplitude.

In addition, the driver limits the transition time of both the rising and falling edges of the driver output voltage to a value, e.g. 1 volt/nano-second, which generates relatively little switching noise but which is still sufficiently fast as to have little, if any, adverse affect on the switching speed of small swing logic connected to the driver output. Control over the falling transition in the driver output signal is provided by limiting the amount of base current available to turn-on both an intermediate stage (i.e. a phase splitter) and the output stage in the driver. This control, provided by the voltage clamp and output transition control circuit, is accomplished by capacitively feeding back a portion of the output signal to the input of an intermediate stage, specifically a phase splitter. Control over the rising transition of the driver output signal is provided through various time constants internal to the driver.

In accordance with a feature of this invention, the inventive driver contains a high impedance control stage which forces the driver output transistors into a non-conducting (off) state, thereby advantageously preventing these transistors from being destroyed during improper power sequencing during power-up. In particular, this circuit forces the output transistors into a non-conducting state as long as either one of two control voltages externally applied to the driver is low. This could occur during a power-up condition or at anytime thereafter in order to force the driver output into a high-impedance state regardless of the data applied to the data input of the driver. Once the driver output is placed in a high-impedance state, any circuitry connected to the input of the driver is isolated from that connected to the output, thereby advantageously simplifying testability of the circuitry.

BRIEF DESCRIPTION OF THE DRAWING

The principles of the present invention may be clearly understood by considering the following detailed description in conjunction with the drawing, in which.

To facilitate understanding, common reference numerals have been used to denote identical elements common to the figures.

DETAILED DESCRIPTION

After reading the following description, those skilled in the art will readily appreciate that the inventive driver can form the output stage of any simple logic configuration of gate circuits (such as AND gates, OR gates and the like) or logic circuit (e.g. processors, memories and the like) that uses small input signal swings and drives an interconnect line. Consequently, for purposes of simplicity and increased ease of understanding, the driver will be discussed in the context of a simple single input inverter.

Figure 1:
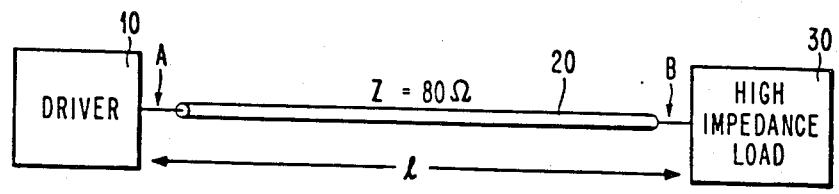
FIG. 1 shows a block diagram of the general manner in which a line driver is often used.

FIG. 1 shows the general manner in which a line driver is often used. Here, driver 10 applies a signal to line 20 at its near end, denoted by the letter "A". Often this line is either unterminated (open), with a nearly infinite load impedance present at its far end, denoted by the letter "B", or feeds a particular load, shown as load 30, having a high finite impedance. In either case, the impedance at the far end greatly exceeds the characteristic impedance of the line, which is usually quite low and here is illustratively 80 ohms.

Whenever driver 10 imparts a voltage transition to the near end of the line, the transition will first propagate to the far end of the line. Next, owing to the impedance mismatch between the characteristic impedance of the line and that of the load, a portion of this transition will reflect off the point of the mismatch, i.e. the far end of the line, and will propagate back to the driver output situated at the near end. The amplitude of the reflected signal depends upon the degree of the mismatch appearing at the far end. The time interval occurring between the time the driver applies the transition to the near end and the time at which the reflected signal reaches the near end is proportional to the length, l, of the line. Although the reflection will be attenuated by resistive losses occurring within the line, the reflected signal that reaches the near end will add with the amplitude of the output signal produced by the driver itself to produce a combined signal at the near end. Depending upon the amplitude of the driver output signal and that of the reflection, the amplitude of the combined signal may, particularly for small signal swing logic circuits, cause erroneous high level logic signals to occur on the line, which, in turn, might cause false operation of any small signal swing logic circuits that are connected to the line. Moreover, should the amplitude of the combined signal significantly exceed that of the driver output signal, then the peak amplitude of the combined signal might possibly exceed the voltage rating of the output transistors which feed the output of driver 10. Should that happen, these transistors may disadvantageously be damaged or destroyed.

Figure 2:
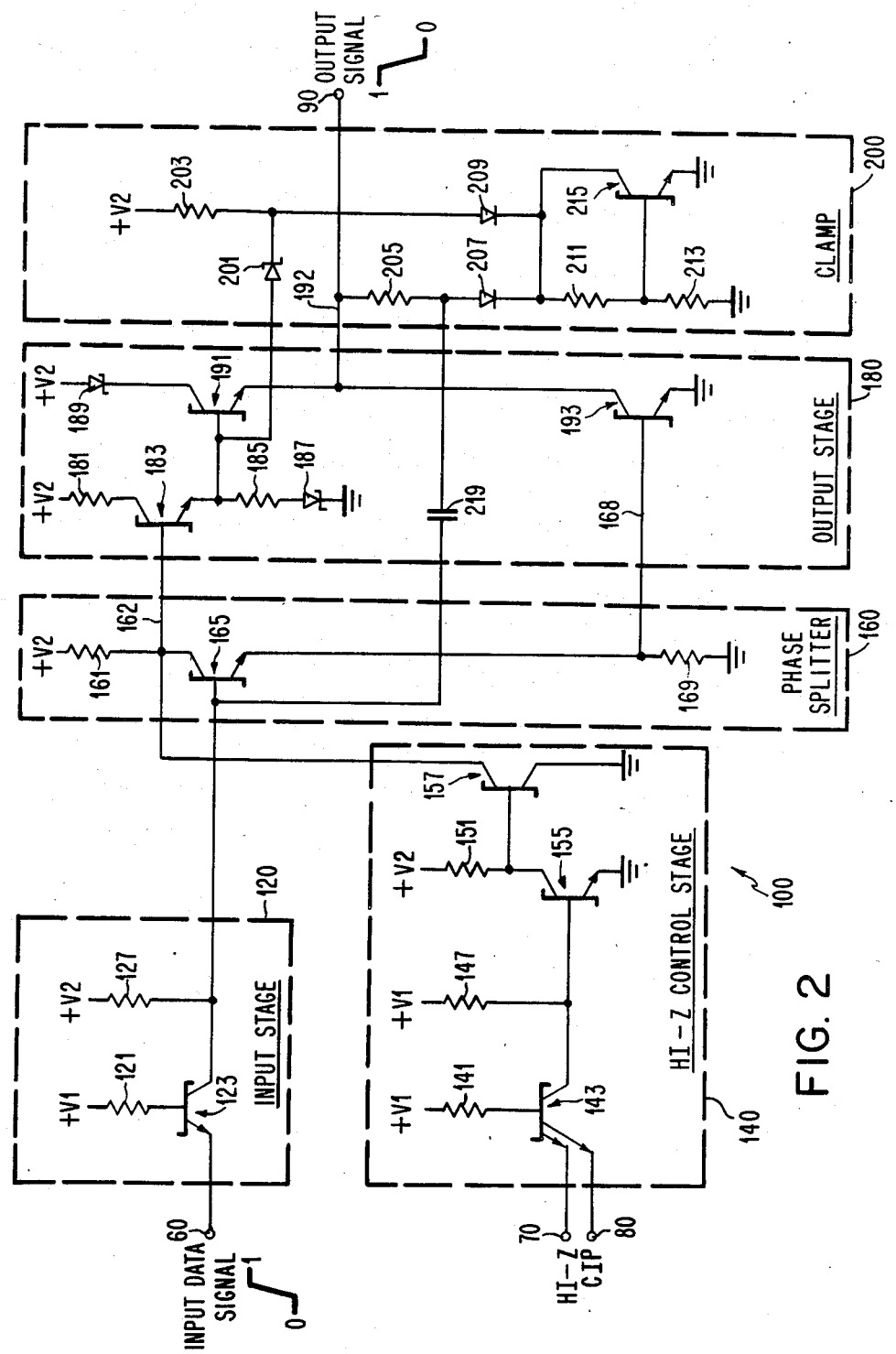
FIG. 2 shows a schematic diagram of line driver 100 which embodies the teachings of the present invention.

Inventive driver 100, shown in FIG. 2, is a small signal swing driver which advantageously reduces the amount of self-generated switching noise and also suppresses voltage transients, resulting from, for example, reflections, that appear on the line and particulary at the output of the driver.

Specifically, driver 100 is comprised of input stage 120, high impedance control stage 140, phase splitter 160, output stage 180 and clamp 200. The values of the power supply voltages $V_1$ and $V_2$ are partially dictated by the allowable swing of the logic levels appearing at the input and output terminals of the driver. For a 1 volt swing, i.e. from +0.5 volts for a logical zero to +1.5 volts for a logical one, power supply voltages $V_1$ and $V_2$ are chosen to be approximately +1.7 and +3.4 volts, respectively.

The data input to the driver is applied to input terminal 60 and, from there, is routed to the emitter of input transistor 123. Transistor 123 will conduct whenever its emitter voltage (the value of the data input signal applied to the driver) is less than 0.9 volts (i.e. $V_1$ less the base-emitter junction drop of 0.7 volts and the voltage drop across resistor 121). Any higher valued input voltage will provide an insufficient drop across the base-emitter junction of this transistor and prevent this transistor from conducting. As such, this transistor establishes the input threshold of the driver to be 9 volts. Resistor 127 serves as a pull-up resistor for the collector of this transistor.

The collector voltage of transistor 123 is applied to the base of transistor 165 within phase splitter 160. Transistor 165 buffers the signal produced by transistor 123 and provides an output signal on lead 168 and its complement on lead 162. The output signal appearing on lead 168 is in-phase with the signal appearing at the collector of transistor 123 and hence is also in-phase with the input data signal applied to terminal 60.

The signals appearing on leads 162 and 168 are applied as inputs to output stage 180. Within the output stage, the signal appearing on lead 162 is applied to transistor 183, which is connected in a Darlington configuration with output transistor 191. The voltage appearing at the emitter of transistor 183 and the signal appearing on lead 168 are applied to output transistors 191 and 193 which are connected together to provide a push-pull output. The emitter voltage of transistor 191 is connected, via lead 192, to output terminal 90 and, from there, to the driven line. To increase the speed of the driver, resistor 185 and Schottky diode 187 provide a discharge path for any charge stored within the collector-base junction of transistor 191 whenever that transistor is non-conducting (i.e. off). Although a Schottky diode advantageously provides a large resistance at certain current ranges, diode 187 could be implemented using a standard p-n junction diode. In this case, the value of resistor 185 would be accordingly decreased over that required if a Schottky diode were used for diode 187. In addition, diode 187 could be eliminated, in which case the value of resistor 185 would need to be increased. However, if diode 187 was removed with resistor 185 connected directly to ground, then the current flowing through this resistor, particularly while transistor 183 was conducting, would be greater than that flowing through both the resistor and the diode and, as such, the driver would disadvantageously consume an increased amount of power. Schottky diode 189, which is situated in the collector circuit of transistor 191, prevents this transistor from being destroyed in the reverse mode should the power supplies be energized in an improper sequence. Specifically, this diode prevents any current from flowing in the reverse direction through the collector junction of transistor 191 should a large positive drive voltage be applied to the emitter of this transistor while the collector power supply voltage, $V_2$, remains at or near ground potential.

Clamp 200 is connected to lead 192 and, in accordance with the teachings of the present invention, establishes the proper output level of the driver and also suppresses transient voltages appearing on the driven line. As described shortly, resistors 203, 205, 211 and 213; diodes 207 and 209, Schottky diode 201 and transistor 215, all located within dashed box 200, comprise a clamp which limits the maximum DC output level provided by the driver and also suppresses transient voltages appearing on the driven line connected to the output of the driver. Clamp 200 along with feedback capacitor 219 will be collectively referred to as the voltage clamp and output transition control circuit. Feedback capacitor 219, connected between the clamp and the input to phase splitter 160, along with resistor 127, limits the slew rate of the falling transition (edge) of the output signal appearing on terminal 90, i.e. the maximum output falling transition time, to approximately 1 volt/nano-second. This reduces the amount of switching noise that the driver generates, and thereby advantageously reduces the noise currents that are coupled onto quiet lines. In addition, the slew rate of the rising transition of the driver output signal appearing on lead 90 is limited to approximately 1 volt/nano-second by the amount of current supplied to the base of transistor 191 and the time constant determined by the emitter-base capacitance of transistors 183 and 191 and the resistance of resistor 161. The amount of base current available to transistor 191 is governed by the amount of emitter current produced by transistor 183, reduced by the amount of current shunted to ground by the series connection of resistor 185 and diode 187. By limiting the rising and falling transition times to approximately 1 volt/nano-second, the driver generates a reduced amount of switching noise—much less than that which would be typically generated by a similar driver which does not limit the slew rate of its output signal. As such, noise currents coupled onto quiet lines, and/or through power supply or ground leads, to other logic circuitry are also kept to a relatively small level. Hence, the likelihood of producing false high level input signals and erroneous operation of any logic circuitry connected to these lines are both advantageously reduced. Moreover, by using small swing logic levels, the switching speed of any circuitry connected downstream of the driver is not adversely affected by limiting the transition rates of the driver output signal to 1 volt/nano-second.

High impedance (HI-Z) control stage 140 is used to place the driver output in a high impedance state regardless of the level of the input data signal present at input terminal 60. In particular, transistors 143 and 155, along with resistors 141 and 147, provide a two input NAND circuit with inputs connected to HI-Z terminal 70 and "chip in place" (CIP) terminal 80. Transistor 157 is an inverter. Normally, high levels are applied to both the HI-Z and CIP input terminals. In this case, both emitters of transistor 143 are high and, as such, this transistor is non-conducting (off). The collector voltage is therefore high and transistor 155 is switched on. As a result, the voltage present at the collector of transistor 155, which is applied to the base of transistor 157, falls to approximately 0.2 volts (the value of the collector-base saturation voltage). Transistor 157 remains off and thereby has no effect on the operation of transistors 165, 183 and 191.

However, as soon as a low voltage is applied to the HI-Z input, transistor 143 conducts which, in turn, markedly decreases the base voltage applied to transistor 155 to a level sufficient to turn it off. As such, the voltage present at both the collector of transistor 155 and at the base of transistor 157 is pulled upward by resistor 151. The collector of transistor 157 is connected to power supply $V_2$, via resistor 161. Hence, when the base voltage applied to this transistor reaches +0.7 volts, transistor 157 conducts and its collector voltage falls to 0.2 volts. Inasmuch as the collector of transistor 157 is wired both to the collector of transistor 165 and to the base of transistor 183, the 0.2 volt level appearing at the collector of transistor 157 causes transistor 183 to become non-conductive (off) regardless of the voltage appearing at the base of transistor 165. In addition, since transistor 165, as shown, incorporates a Schottky diode across its collector-base junction, this transistor will also become completely non-conductive whenever its collector voltage drops to 0.2 volts regardless of the state of the input signal applied to input terminal 60. In particular, if the signal applied to the input terminal is low, then the collector voltage present at transistor 123 will itself be insufficient, when applied to the base of transistor 165, to turn the latter transistor on. Alternatively, if the voltage applied to input terminal 60 is high, then the Schottky diode within transistor 165 will become forward biased through resistor 127 and hence approximately 0.5 volts will appear across this diode. As such, the base voltage at transistor 165 will remain at approximately 0.7 volts which, with resistor 169 connected to its emitter, is simply not a sufficiently positive level to cause transistor 165 to conduct. Consequently, no emitter current flows in transistor 165. Thus, no base current is provided for output transistor 193, and this transistor is turned off as well. Since transistor 183 is also off, no base current is provided for output transistor 191 and this output transistor is also turned off. Consequently, no current flows to output terminal 90 and hence this output assumes a high impedance state regardless of the voltage applied to input terminal 60.

CIP terminal 80, like HI-Z terminal 70, permits the driver to assume a high impedance output state regardless of the input data signal applied to input terminal 60. The CIP terminal is primarily used for testing integrated circuits (chips) containing a number of separate drivers. In particular, all the CIP terminals of the drivers which feed a common circuit, such as a bus or the like, could be wired together and a common signal applied thereto. By applying a single low level to all these CIP inputs, all the drivers connected to the bus will assume a high-impedance state and thereby isolate the circuit connected to their inputs from the bus. In this manner, circuitry connected to the bus, such as that existing on other chips, other printed circuit boards or the like, can be readily tested. Hence, one or more selected chips, printed circuit boards or even complete sub-systems could be easily isolated from other circuitry through the use of appropriate signals applied to the CIP inputs.

Moreover, HI-Z control stage 140 advantageously renders the driver immune to improper power sequencing, occurring during power-up, between the power supplies used for the driver and those used for the input and output circuits connected to the driver. This is particularly important whenever the outputs of more than one driver are connected to a common interconnect line. In the past, whenever prior art drivers were interconnected in this fashion, a driver could be placed in an erroneous logic state which could damage or destroy one or more of the drivers. In contrast, the inventive driver is immune to an erroneous logic state occurring, for example, during power-up. Specifically, if both driver power supplies, i.e., V2 and ground, are erroneously switched on before those used for the other circuitry, i.e., V1, when the voltage appearing at 162 will be low thereby forcing the driver into its high impedance state until such time as the voltages at inputs 60, 70 or 80 reach their proper value. As a result, output transistors 191 and 193 are prevented from being switched on and destroyed due to excessive load current flowing therethrough and resulting from improper power sequencing. In fact, to further ensure against any false logical values appearing at output terminal 90 during power-up, application of a high level applied to HI-Z terminal 70 could be delayed by a finite interval of time after the voltages produced by all the power supplies have settled. This assures that no signal is provided by the driver to any circuitry connected to the driver output terminal until after this delay interval has elapsed and the entire digital system, including the driver, is ready to begin operation.

With the foregoing in mind, the discussion will now shift to describing the operation of the clamp and particularly the manner in which the clamp limits the maximum DC level produced by the driver and also suppresses transients appearing on the driven line.

Resistors 203, 211 and 213, along with diode 209, determine the DC threshold level (approximately +1.7 volts) at which the clamp will begin to conduct during an output transition, thereby establishing the maximum DC output level of the driver. In particular, assuming a high level signal (+1.5 volts) appears at output terminal 90, then approximately 1 volt appears at the collector of transistor 215. This follows inasmuch as 0.7 volts appears across diode 209, 0.5 volts appears across Schottky diode 201 and hence the base voltage of forward biased output transistor 191 equals 2.2 volts. Hence, the emitter voltage of this transistor equals the base voltage, 2.2 volts, less the forward biased emitter-base junction drop of 0.7 volts. This results in an emitter voltage for transistor 191 and hence an output voltage, appearing at terminal 90, of 1.5 volts. Moreover, with a high level output signal, the input signal must be low. In this case, transistor 123 will be conducting and 165 will be non-conducting (off). Consequently, the voltage at the collector of transistor 165 can indeed increase to 2.2 volts.

Furthermore, with the collector of transistor 215 at approximately 1 volt, the difference between the high level output voltage (approximately +1.5 volts) and the collector voltage at this transistor (approximately +1 volt) will appear across diode 207 and resistor 205. With only a high level output (+1.5 volts) appearing at output terminal 90, the voltage difference (typically 500-600 millivolts) appearing across diode 207 will either be insufficient to cause it to conduct at all or only enough to cause it to conduct an insignificant amount of current. Hence, very little base current will flow in transistor 215.

Now, assume that the DC output level of the driver increases or a transient occurs on the line and appears at terminal 90. This transient can result from a reflection and could cause a significantly increased voltage to appear at the near end of the driven line and hence at output terminal 90. The transient or over-voltage condition will be suppressed by the clamp in the following manner.

Figure 3:
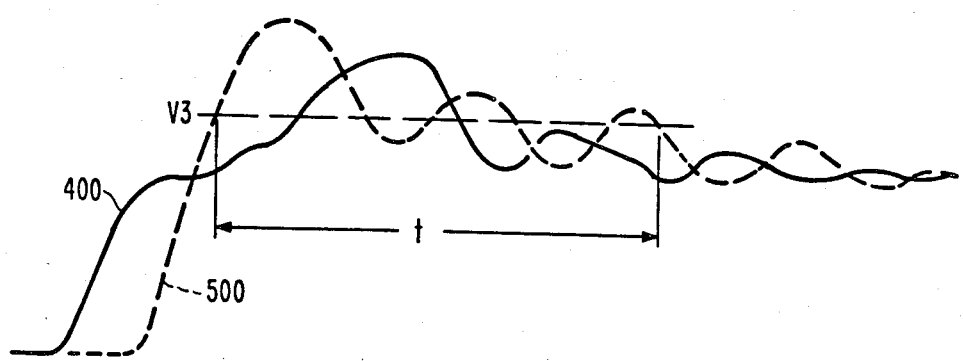
FIG. 3 shows a voltage waveform that typically occurs at each end of line 20 whenever driver 100, shown in FIG. 2, is used for driver 10 shown in FIG. 1.

Once the transient voltage increases over approximately 1.7 volts, diode 207 begins to conduct heavily. This, in turn, increases the current flowing through resistors 211 and 213 and thereby increases the base current and the emitter-base voltage for transistor 215. As a result, the collector current flowing in this transistor increases. As such, transistor 215, resistor 205 and diode 207 sink an increasing amount of current originating from the output terminal and hence from the driven line. As long as the output voltage remains above 1.7 volts, resistor 205, diode 207 and transistor 215 provide a low resistance current sink from the driven line to ground. Moreover, as each peak in a transient reflected signal reaches the near end of the driven line, i.e. the output of the driver, and the amplitude of the total voltage appearing at the output terminal exceeds 1.7 volts, clamp 200 will absorb a portion of the energy contained in each peak. Owing to the resistive losses in the line and the energy absorbed by the clamp, each successive peak of the transient which appears at the near end will be less than the preceeding peak and the clamp will absorb a decreasing amount of energy. By draining energy from the driven line, clamp 200 increases the damping imparted to each reflected signal. The clamp will become inactive once the peak voltage appearing at the near end drops to 1.7 volts at which point both diode 207 and transistor 215 will cease to conduct heavily and the near end output voltage will stabilize at the proper output level. In this manner, use of the clamp advantageously reduces the settling time of the transient. For example, if driven line 20 shown in FIG. 1 is 40 centimeters long and clamp 200 were not used, then a reflection induced transient would only be damped by the resistive losses in the line and hence may last for a several hundreds of nano-seconds. When clamp 200 is used and the value of resistor 205 has been chosen to be 100 ohms, then clamp 200 would shorten the settling time (t) of the transient to approximately 25 nano-seconds. The settling time is primarily determined by the magnitude of resistor 205 and the length, l, of the driven line. With the use of driver 100, the waveform of a reflection induced transient appearing at the near (driver output) and far ends of a driven line generally resemble that shown by waveforms 400 and 500, respectively, in FIG. 3. Clearly, the clamp can suppress many different types of voltage transients, not just reflection based transients but also spikes and surges, which appear on the line and, more specifically, at the output terminal of the driver.

As noted previously, the capacitive feedback provided by capacitor 219 limits the minimum transition time of the falling edge of the output voltage produced by the driver and appearing at output terminal 90. To do so, capacitor 219 and resistor 205 together feed back a portion of the output signal appearing on lead 90 to the base of transistor 165. Now, with the output at a high level, transistor 165 is non-conducting. As the input voltage appearing at terminal 60 increases in amplitude, both the collector voltage of transistor 123 and the base voltage of transistor 165 also increases. As the current through the collector of transistor 165 increases, so too does the base current through transistor 193, which, in turn, causes the collector voltage of this transistor to decrease. However, as the voltage appearing at output terminal 90 begins to increase, the current through capacitor 219 quickly changes—it is dependent upon the derivative of the voltage appearing across the capacitor—and shunts drive current away from the base of transistor 165. As such, less drive current is available for this transistor, thereby slowing the rate at which this transistor turns on. As more base current is diverted away from transistor 193, this transistor will require a longer period of time during which to turn on. Eventually, transistor 165 will fully conduct on a steady state basis; at which point, no current will flow through capacitor 219. By selecting the value of capacitor 219, resistor 127 and resistor 205 properly, the maximum transition time of the falling edge of the driver output voltage can be limited to 1 volt/nano-second.

In general, a driver has an input and an output circuit. The input circuit may have one or more serially connected intermediate stages, each producing a corresponding intermediate signal. For the driver described above, input stage 120 and phase splitter 160 are intermediate stages and together form the input circuit. Output stage 180 forms the output circuit. Capacitor 219 is shown as being connected to the input of a particular intermediate circuit, here phase splitter 160. However, for a different driver which nonetheless embodies the teachings of the present invention, capacitive feedback, similar to that provided by capacitor 219, to control the falling edge transition time of the driver output signal may be provided to an input of any one of many different intermediate stages. The particular stage used and the amount of required capacitive feedback depends upon the actual design of the driver.

Ideally, to fully suppress reflections and other transients occurring in a driven line, the above-described clamp should be incorporated into both the line driver and line receiver that are connected to each end of the line. Nonetheless, if the clamp is only placed in the line driver, then effective suppression will still result, and the line receiver design need not address impedance matching and transient suppression. This, in turn, simplifies the design of the receiver and reduces the area needed on an integrated circuit to implement the receiver.

Although a single illustrative embodiment of the invention has been shown and discussed above, many other embodiments incorporating the teachings of the present invention could be readily constructed by those skilled in the art.

We claim:

1. A driver for applying a digital output signal to an interconnect line, said driver comprising:
   an input stage, responsive to a digital data input signal, for producing an intermediate signal in phase with said digital data signal, and
   a phase splitter, responsive to said intermediate signal for producing two substantially equal and opposite signals,
   an output circuit responsive to said equal and opposite signals for producing the digital signal and for driving said interconnect line with said digital output signal, and
   a voltage clamp and output transition control circuit, connected between the out put of the driver and an input of the phase splitter, wherein said voltage clamp and transition control circuit comprises:
   a first resistor connected at a first end thereof to the driver output and at the second end thereof to an anode of a first diode and to a first end of a capacitor,
   said first diode connected at its cathode to a first end of a second resistor,
   a third resistor connected at its first end to the second end of the second resistor and at its second end to ground potential,
   a transistor having its collector connected to the first end of the second resistor, its base connected to the first end of the third resistor and its emitter connected to ground, and
   a second diode having its cathode connected to the collector of the transistor and at its anode connected through a fourth resistor to a source of positive voltage, and
   said capacitor connected at its second end thereof to the input of the phase splitter.

2. The driver in claim 1 wherein said output circuit further comprises two output transistors, wired in a push-pull configuration and each of said transistors is responsive to an associated one of said equal and opposite signals, with the signal present at a point of connection between said output transistors being said driver output signal.

3. The driver in claim 2 wherein the voltage clamp and output transition control circuit further comprises a Schottky diode which is connected at its cathode to one end of the fourth resistor and at its anode to the base of a selected one of said output transistors.

4. A driver for applying a digital output signal to an interconnect line, the driver comprising:
   an input circuit, responsive to a digital data input signal applied to a data input of the driver, the input circuit comprising at least one serially connected intermediate circuit, each intermediate circuit producing a corresponding intermediate signal;
   an output circuit, responsive to at least one of the intermediate signals, for producing the digital output dignal; and
   a clamp and output transition control circuit, connected between the output of the driver and an input of at least one of the intermediate circuits, for sinking current from the output of the driver whenever the voltage at the output of the driver exceeds a pre-selected threshold value and for controlling a falling transition time in the digital output signal produced by the driver, which comprises:
   (a) sinking means, connected to the output of the driver, for sinking current whenever the voltage at the output of the driver exceeds the value of the threshold voltage; and
   (b) a capacitor, connected at a first end to the input of at least one of the intermediate circuits and connected at a second end to said sinking means, for controlling the falling transition time.

5. The driver of claim 4 wherein the sinking means comprises:
   a first resistor connected at a first end thereof to the output of the driver and at a second end thereof to an anode of a first diode and to a second end of the capacitor;
   the first diode connected at its cathode to a first end of a second resistor;
   a third resistor connected at its first end to a second end of the second resistor and at its second end to ground potential;
   a transistor having its collector connected to the first end of the second resistor, its base connected to the first end of the third resistor, and its emitter connected to ground potential; and
   a second diode having its cathode connected to the collector of the transistor and at its anode connected through a fourth resistor to a source of positive voltage.

6. The driver in claim 5 further comprising means for limiting the rising transition time in the digital output signal produced by the driver.

7. The driver in claim 6 further comprising means, responsive to at least one externally applied control signal and connected to said output circuit, for causing the driver output to assume a high impedance state regardless of the state of the input digital data signal.

8. The driver in claim 7 wherein the input circuit comprises:
   an input stage, responsive to the digital data input signal, for producing a second intermediate signal in phase with said input signal, and
   a phase splitter, responsive to said second intermediate signal for producing two substantially equal and opposite signals.

9. The driver in claim 8 wherein said output circuit further comprises two output transistors, wired in a push-pull configuration and each of said transistors is responsive to an associated one of said equal and opposite signals, with the signal present at a point of connection between said output transistors being said driver output signal.

10. The driver in claim 9 wherein the clamp and output transition control circuit further comprises a Schottky diode which is connected at its cathode to one end of the fourth resistor and at its anode to the base of a selected one of said output transistors.

* * * * *

UNITED STATES PATENT AND TRADEMARK OFFICE
CERTIFICATE OF CORRECTION

PATENT NO. : 4,682,050

DATED : July 21, 1987

INVENTOR(S) : Herve L. Beranger et al

It is certified that error appears in the above-identified patent and that said Letters Patent is hereby corrected as shown below:

Column 11, line 5, after "data" insert --input--;

line 10, after "digital" insert - output--;

line 14, change "out put" to --output--.

Signed and Sealed this

Thirteenth Day of September, 1988

*Attest:*

DONALD J. QUIGG

*Attesting Officer*      *Commissioner of Patents and Trademarks*